(12) United States Patent
Chou et al.

(10) Patent No.: US 11,075,155 B2
(45) Date of Patent: Jul. 27, 2021

(54) PACKAGE STRUCTURE AND MANUFACTURING METHOD THEREOF

(71) Applicant: InnoLux Corporation, Miao-Li County (TW)

(72) Inventors: Hsueh-Hsuan Chou, Miao-Li County (TW); Chia-Chieh Fan, Miao-Li County (TW); Cheng-Chi Wang, Miao-Li County (TW); Kuan-Jen Wang, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 16/655,201

(22) Filed: Oct. 16, 2019

(65) Prior Publication Data

US 2020/0051902 A1 Feb. 13, 2020

Related U.S. Application Data

(62) Division of application No. 15/854,728, filed on Dec. 26, 2017, now Pat. No. 10,490,493.

(Continued)

(30) Foreign Application Priority Data

Sep. 1, 2017 (CN) .......................... 201710779909.5

(51) Int. Cl.
*H01L 21/66* (2006.01)
*H01L 23/498* (2006.01)
(Continued)

(52) U.S. Cl.
CPC ...... *H01L 23/49838* (2013.01); *H01L 21/486* (2013.01); *H01L 21/4853* (2013.01); *H01L 21/4857* (2013.01); *H01L 21/561* (2013.01); *H01L 21/565* (2013.01); *H01L 21/568* (2013.01); *H01L 21/6835* (2013.01); *H01L 21/78* (2013.01); *H01L 22/14* (2013.01); *H01L 22/32* (2013.01); *H01L 23/3114* (2013.01); *H01L 23/49816* (2013.01);
(Continued)

(58) Field of Classification Search
CPC ..... H01L 21/78; H01L 21/561; H01L 21/568; H01L 21/6835; H01L 21/486; H01L 21/565; H01L 21/4857; H01L 22/32; H01L 22/14; H01L 23/3128; H01L 23/3114; H01L 23/49816; H01L 23/49838; H01L 24/16; H01L 24/81
USPC .............................................. 438/15; 257/48
See application file for complete search history.

(56) References Cited

U.S. PATENT DOCUMENTS 6,081,429 A 6/2000 Barrett
6,230,400 B1 * 5/2001 Tzanavaras ............. H01L 24/12
29/840

(Continued)

*Primary Examiner* — Luan C Thai
(74) *Attorney, Agent, or Firm* — Winston Hsu

(57) ABSTRACT

A package structure includes a redistribution layer having a first surface, a second surface disposed opposite to the first surface, and at least one sidewall connected to the first surface and the second surface, at least one bonding electrode disposed on the first surface of the redistribution layer, and a mounting layer disposed on the second surface of the redistribution layer. The mounting layer includes a plurality of conductive pads that are spaced apart from each other. At least one of the conductive pads is exposed by the sidewall of the redistribution layer.

9 Claims, 17 Drawing Sheets

Related U.S. Application Data

(60) Provisional application No. 62/467,254, filed on Mar. 6, 2017, provisional application No. 62/440,413, filed on Dec. 30, 2016.

(51) Int. Cl.
*H01L 21/48* (2006.01)
*H01L 21/683* (2006.01)
*H01L 23/00* (2006.01)
*H01L 21/78* (2006.01)
*H01L 21/56* (2006.01)
*H01L 23/31* (2006.01)

(52) U.S. Cl.
CPC .......... *H01L 24/81* (2013.01); *H01L 23/3128* (2013.01); *H01L 24/13* (2013.01); *H01L 24/16* (2013.01); *H01L 24/97* (2013.01); *H01L 2221/68345* (2013.01); *H01L 2221/68359* (2013.01); *H01L 2221/68381* (2013.01); *H01L 2224/05611* (2013.01); *H01L 2224/05644* (2013.01); *H01L 2224/05655* (2013.01); *H01L 2224/131* (2013.01); *H01L 2224/13082* (2013.01); *H01L 2224/13111* (2013.01); *H01L 2224/13144* (2013.01); *H01L 2224/13155* (2013.01); *H01L 2224/16227* (2013.01); *H01L 2224/16235* (2013.01); *H01L 2224/16238* (2013.01); *H01L 2224/16502* (2013.01); *H01L 2224/80411* (2013.01); *H01L 2224/80444* (2013.01); *H01L 2224/80455* (2013.01); *H01L 2224/81005* (2013.01); *H01L 2224/81411* (2013.01); *H01L 2224/81444* (2013.01); *H01L 2224/81455* (2013.01); *H01L 2224/81805* (2013.01); *H01L 2224/97* (2013.01); *H01L 2924/15311* (2013.01); *H01L 2924/15313* (2013.01); *H01L 2924/181* (2013.01); *H01L 2924/18161* (2013.01); *H01L 2924/37001* (2013.01)

(56) References Cited

U.S. PATENT DOCUMENTS

| | | | |
|---|---|---|---|
| 6,709,897 B2 * | 3/2004 | Cheng | H01L 24/05 438/121 |
| 7,087,991 B2 * | 8/2006 | Chen | H01L 23/5389 257/698 |
| 8,350,263 B2 | 1/2013 | Oda | |
| 9,263,410 B2 | 2/2016 | Guo | |
| 9,653,445 B2 | 5/2017 | Lin | |
| 9,847,269 B2 * | 12/2017 | Lin | H01L 23/295 |
| 10,068,853 B2 * | 9/2018 | Hu | H01L 21/565 |
| 10,515,923 B2 * | 12/2019 | Chang | H01L 21/4846 |
| 2007/0080416 A1 | 4/2007 | Yoshioka | |
| 2009/0121337 A1 | 5/2009 | Abe | |
| 2010/0200965 A1 | 8/2010 | Liao | |
| 2014/0252604 A1 | 9/2014 | Motoyoshi | |
| 2016/0118333 A1 | 4/2016 | Lin | |
| 2018/0151507 A1 | 5/2018 | Chen | |

* cited by examiner

PACKAGE STRUCTURE AND MANUFACTURING METHOD THEREOF

CROSS REFERENCE TO RELATED APPLICATIONS

This patent application is a division of U.S. application Ser. No. 15/854,728 filed on Dec. 26, 2017, which claims the benefit of U.S. provisional application No. 62/440,413, filed Dec. 30, 2016, and claims the benefit of U.S. provisional application No. 62/467,254, filed Mar. 6, 2017, and the entire contents of which are incorporated herein by reference.

BACKGROUND OF THE DISCLOSURE

1. Field of the Disclosure

The present disclosure relates to a package structure and manufacturing method thereof, and more particularly, to a panel level package structure and manufacturing method thereof.

2. Description of the Prior Art

In electronic package technologies, fan-out wafer level package (FOWLP) technology includes forming electronic devices on wafer and performing packaging process and sawing process. However, the diameter of regular large-size wafer nowadays is only about 300 mm, thus the amount of electronic devices that can be manufactured and packaged on a wafer at the same time is limited. Hence, it is necessary to develop a technology that can replace the current FOWLP technology.

Furthermore, the mature manufacturing process of conventional FOWLP is to first dispose electronic devices on the carrier such as wafer and then form the redistribution layer on the electronics devices. Generally, in order to increase product yield, electronic devices with defects will be excluded first so as to use qualified electronic devices for forming the package and to sequentially form redistribution layer and perform other subsequent processes during the manufacture. However, if any other defects appear in the subsequent processes, the qualified electronic devices being packaged as well as the whole package structure has to be scrapped, which causes the waste of materials and devices and the increase of cost. As a result, the conventional method of manufacturing the package still needs to be further improved.

SUMMARY OF THE DISCLOSURE

According to an embodiment of the present disclosure, a package structure is provided. The package device includes a redistribution layer, at least one bonding electrode, and at least one testing electrode. The redistribution layer includes a first distribution region and a second distribution region, wherein the second distribution region is disposed adjacent to the first distribution region. The bonding electrode is disposed on a first surface of the redistribution layer. The testing electrode is disposed on the first surface. The bonding electrode overlaps the first distribution region, and the testing electrode overlaps the second distribution region.

According to another embodiment of the present disclosure, a package structure is further provided. The package structure includes a redistribution layer, at least one bonding electrode, and a mounting layer. The redistribution layer includes a first surface, a second surface disposed opposite to the first surface, and at least one sidewall connected to the first surface and the second surface. The bonding electrode is disposed on the first surface of the redistribution layer. The mounting layer is disposed on the second surface of the redistribution layer and includes a plurality of conductive pads that are spaced apart from each other. At least one of the conductive pads is exposed by the sidewall of the redistribution layer.

According to an embodiment of the present disclosure, a method of manufacturing a package structure is also provided. The method of manufacturing the package structure includes providing a substrate, wherein a width of the substrate in any direction is greater than or equal to 400 mm. After that, a release layer is formed on the substrate, and then a mounting layer is formed on the release layer, wherein the mounting layer is a patterned layer and includes a plurality of conductive pads spaced apart from each other. Next, a redistribution layer is formed on the release layer and the conductive pads, wherein the redistribution layer has a first surface at a side of the redistribution layer opposite to the release layer, and at least one bonding electrode is disposed at the first surface of the redistribution layer. After that, at least one electronic device is bonded on the first surface of the redistribution layer to electrically connect the electronic device to the bonding electrode. Next, a molding layer is formed on the first surface of the redistribution layer. A separation process is further performed to separate the release layer and the substrate from the redistribution layer and the mounting layer. Then, a solder ball is formed on one of the conductive pad.

These and other objectives of the present disclosure will no doubt become obvious to those of ordinary skill in the art after reading the following detailed description of the embodiment that is illustrated in the various figures and drawings.

DETAILED DESCRIPTION

Figure 1:
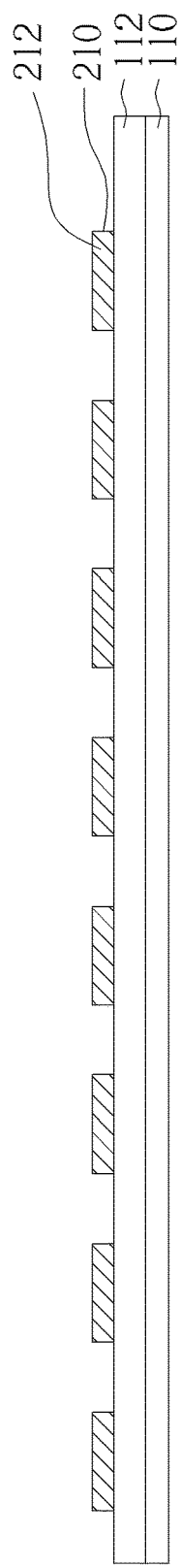
FIG. 1 to FIG. 7 are cross-sectional schematic diagrams illustrating fabrication processes of a method of manufacturing a package structure according to a first embodiment of the present disclosure.

To provide a better understanding of the present disclosure to those skilled in the art, embodiments will be detailed as follows. The preferred embodiments of the present disclosure are illustrated in the accompanying drawings with numbered elements to elaborate on the contents and effects to be achieved. It is needed to note that the drawings are simplified schematic diagrams, and therefore, the drawings show only the components and combinations associated with the present disclosure, so as to provide a clearer description of the basic architecture or method of implementation of the present disclosure. The components would be complex in reality. In addition, for explanation, the components shown in the drawings of the present disclosure are not drawn to the actual number, shape, and dimensions, and the detail can be adjusted according to the design requirements.

When the terms "include", "comprise" and/or "have" are used in the description of the present disclosure, the corresponding features, areas, regions, steps, operations and/or components would be pointed to existence, but not limited the existence or addition of one or more corresponding or other features, areas, regions, steps, operations and/or components. When the corresponding component such as layer or area is referred to "on another component (or the variant thereof)" or "extend to another component", it may be directly on another component or directly extend to another component, or other component may exist between them. On the other hand, when the component is referred to "directly on another component (or the variant thereof)" or "directly extend to another component", any component does not exist between them. And, when the component is referred to "be coupled to another component (or the variant thereof)", it may be directly connected to the another component, or may be indirectly connected (such as electrically connected) to the another component through other component or components.

It should be noted that the technical features in different embodiments described in the following can be replaced, recombined, or mixed with one another to constitute another embodiment without departing from the spirit of the present disclosure.

Referring to FIG. 1 to FIG. 7, FIG. 1 to FIG. 7 are cross-sectional schematic diagrams illustrating fabrication processes of a method of manufacturing a package structure according to a first embodiment of the present disclosure. As shown in FIG. 1, according to the method of manufacturing the package structure of the present disclosure, a substrate 110 is first provided. In this embodiment, a width of the substrate 110 in any direction is greater than or equal to 400 mm, and the substrate 110 has a shape of square or rectangle. For example, the substrate 110 may be a glass substrate with a length of 650 mm to 2500 mm a width of 550 nm to 2200 mm. As an example, the substrate 110 can be a substrate with a size of 650 mm in length and 550 mm in width or a substrate with a size of 720 mm in length and 600 in width, but not limited thereto. The substrate 110 may have any other size greater than 550 mm. The size of the substrate 110 in this embodiment is 720 mm×600 mm, but not limited thereto. After providing the substrate 110, a release layer 112 is formed on the substrate 110, and then a mounting layer 210 is formed on the release layer 112, wherein the mounting layer 210 is a patterned layer and includes a plurality of conductive pads 212 that are spaced apart from each other. The method of manufacturing the patterned mounting layer 210 may include first forming a conductive layer (not shown) including metal material for instance on the release layer 112 and then performing a patterning process, such as lithography and etching (PEP) process, to the conductive layer to form the conductive pads 212.

Figure 2:
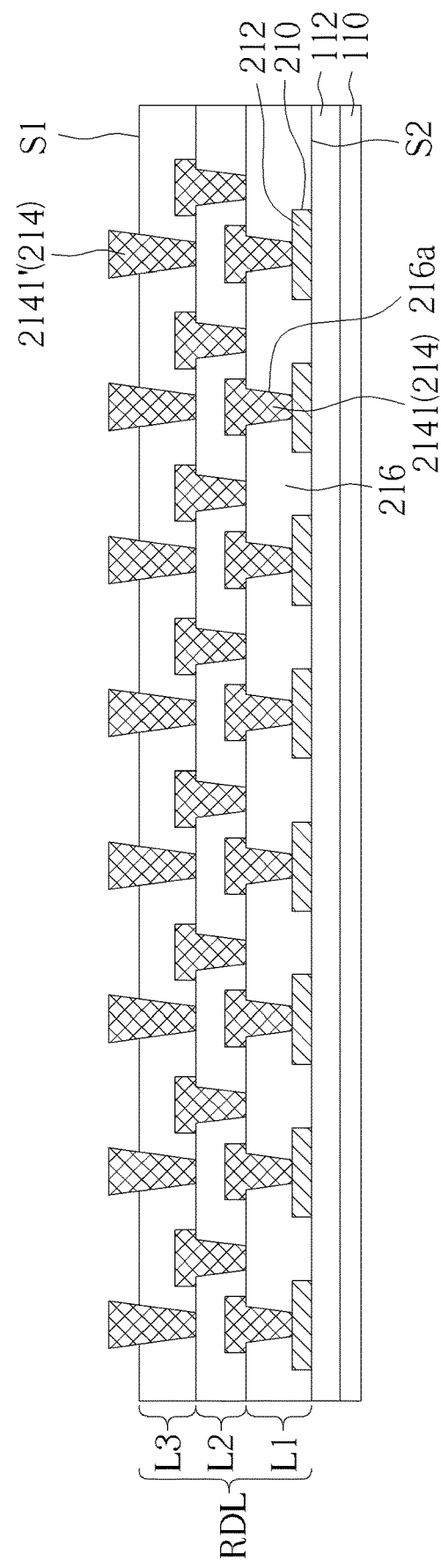

Referring to FIG. 2, a redistribution layer RDL is then formed on the release layer 112 and the conductive pads 212, wherein the redistribution layer RDL includes at least one patterned conductive layer 214, at least one dielectric layer 216 and at least one through hole 216a, which means the redistribution layer RDL may include a plurality of dielectric layers 216, a plurality of patterned conductive layers 214 and a plurality of through holes 216a corresponding to the dielectric layers 216, in order to redistribute the circuit. For example, as shown in FIG. 2 of this embodiment, the redistribution layer RDL may have a first redistribution layer L1, a second redistribution layer L2 and a third redistribution layer L3, wherein each of the first redistribution layer L1, the second redistribution layer L2 and the third redistribution layer L3 has a patterned conductive layer 214, a dielectric layer 216 and a plurality of through holes 216a that penetrate through the dielectric layer 216 to connect adjacent patterned conductive layers 214 of the first redistribution layer L1, the second redistribution layer L2 and the third redistribution layer L3, but not limited thereto. The step of forming the first redistribution layer L1 includes forming a first dielectric layer 216 on the release layer 112, forming one or more through holes 216a in the first dielectric layer 216 to expose the conductive pads 212, forming a conductive layer on the first dielectric layer 216, wherein the conductive layer fills the through holes 216a to be in contact with the exposed conductive pads 212, and then a patterning process is performed to the conductive layer to form a patterned conductive layer 214, wherein the patterned conductive layer 214 includes a plurality of redistribution wires 2141 and each conductive pad 212 in this embodiment is corresponding to and electrically connected to one of the redistribution wires 2141, but not limited thereto. After that, the second redistribution layer L2 is formed through similar processes. For example, a second dielectric layer 216 is formed on the first redistribution layer L1, a plurality of through holes 261a are formed in the second dielectric layer 216 to expose the redistribution wires 2141 on the surface of the first redistribution layer L1, and a second conductive layer (not shown) is exposed on the second dielectric layer 216 wherein the through holes 216a in the second dielectric layer 216 are filled by the second conductive layer, and then patterning the second conductive layer to form a patterned conductive layer 214 of the second redistribution layer L2, wherein the patterned conductive layer 214 of the second redistribution layer L2 also includes a plurality of redistribution wires 2141 in contact with and electrically connected to the corresponding redistribution wires 2141 of the first redistribution layer L1 through the through holes 216a in the second redistribution layer L2. The process of forming the third redistribution layer L3 is similar to the above-mentioned process and will not be described redundantly. As shown in FIG. 2, the redistribution layer RDL has a first surface S1 and a second surface S2. The first surface S1 is at a side of the redistribution layer RDL opposite to the release layer 112, and the second surface S2 is a surface of the redistribution layer RDL opposite to the first surface S1. In other words, the second surface S2 is opposite to the first surface S1 and is the surface of the redistribution layer RDL that contacts the release layer 112. In addition, the mounting layer 210 is disposed on the second surface S2 of the redistribution layer RDL. It is noted that in this embodiment the third redistribution layer L3 at the top of the redistribution layer RDL can be used for bonding with an electronic device which will be disposed in a later process, thus the third redistribution layer L3 can be considered as a bonding layer or bumping layer and the redistribution wires 2141 of the third redistribution layer L3 include at least one bonding electrode 2141', wherein the bonding electrode 2141' is exposed by the first surface S1 of the redistribution layer RDL. In other words, the bonding electrode 2141' is disposed at the first surface S1 of the redistribution layer RDL for bonding with the electronic device. The above-mentioned electronic device may include a chip, a processor, a die, an integrated circuit, or other related active elements or passive elements. In this embodiment, at least one conductive pad 212 is electrically connected to one of the bonding electrodes 2141'.

Figure 3:
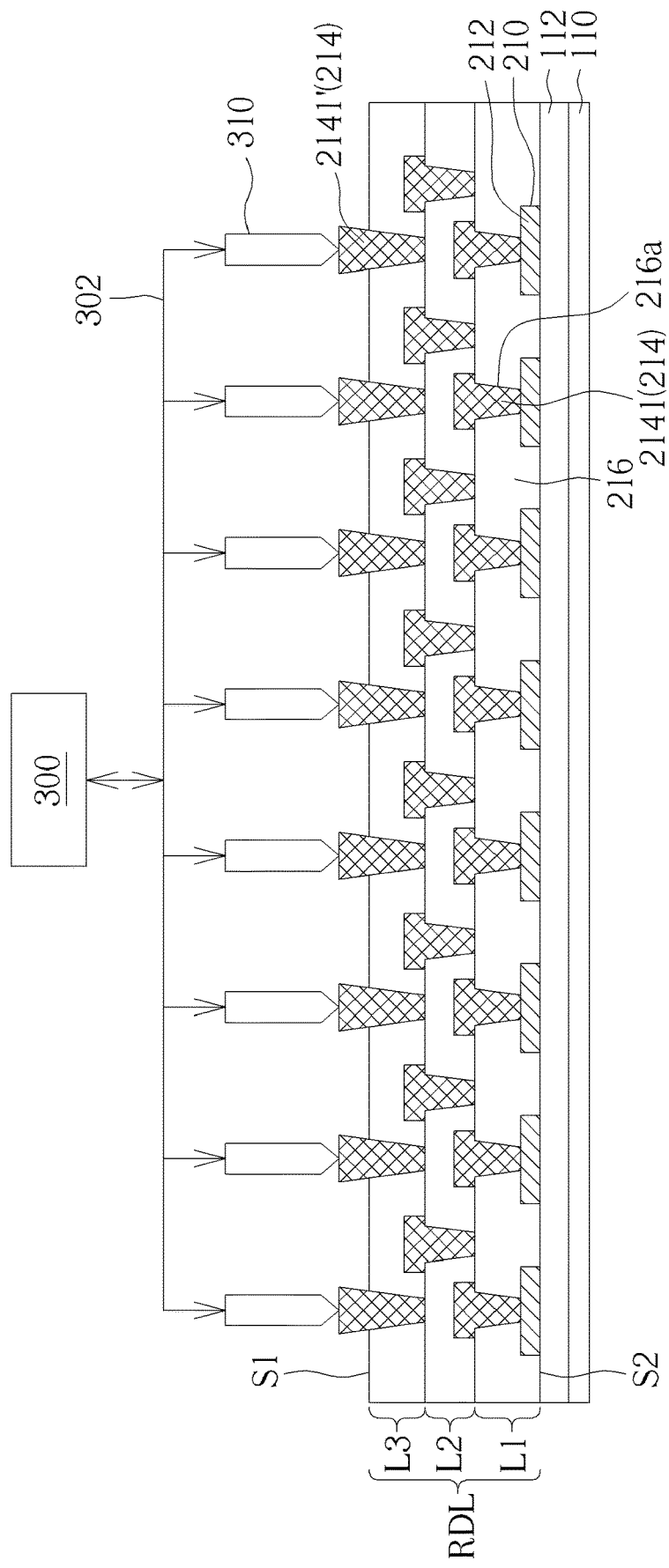

Referring to FIG. 3, after forming the redistribution layer RDL and before bonding the electronic device, a first phase test can be selectively performed by using at least one probe 310 to directly contact one of the bonding electrodes 2141' for performing a short test of the redistribution layer RDL. For example, a testing machine 300 which includes a plurality of probes 310 is provided, wherein each of the probes 310 is electrically connected to the testing machine 300 through a corresponding conductive wire 302, and each of the bonding electrodes 2141' is in contact with a probe 310 respectively for electrical connection. Accordingly, the testing machine 300 can be used to perform a short test for each of the redistribution wires 2141 of the redistribution layer RDL, so as to detect if any defect exists in the redistribution layer RDL.

The method of manufacturing the package substrate of the present disclosure is an RDL-first process, which means the redistribution layer RDL is first formed on the substrate 110 and then the electronic device is bonded on the redistribution layer RDL. Therefore, the test to the redistribution layer RDL can be performed before bonding the electronic device on the redistribution layer RDL. By performing the short test, the fabrication yield or performance of the redistribution layer RDL can be confirmed, and thus the portion of the redistribution layer RDL with worse performance or defect can be selectively repaired or excluded. Then, according to the testing result of the short test, the following manufacturing process can be proceeded to the redistribution layer RDL that pass the short test, so as to prevent the final-manufactured package structure from having low product yield or performance due to the defects of the redistribution layer RDL and prevent the cost waste of materials of following processes. As a result, the overall manufacturing yield of the package structure of the present disclosure can be increased.

Figure 4:
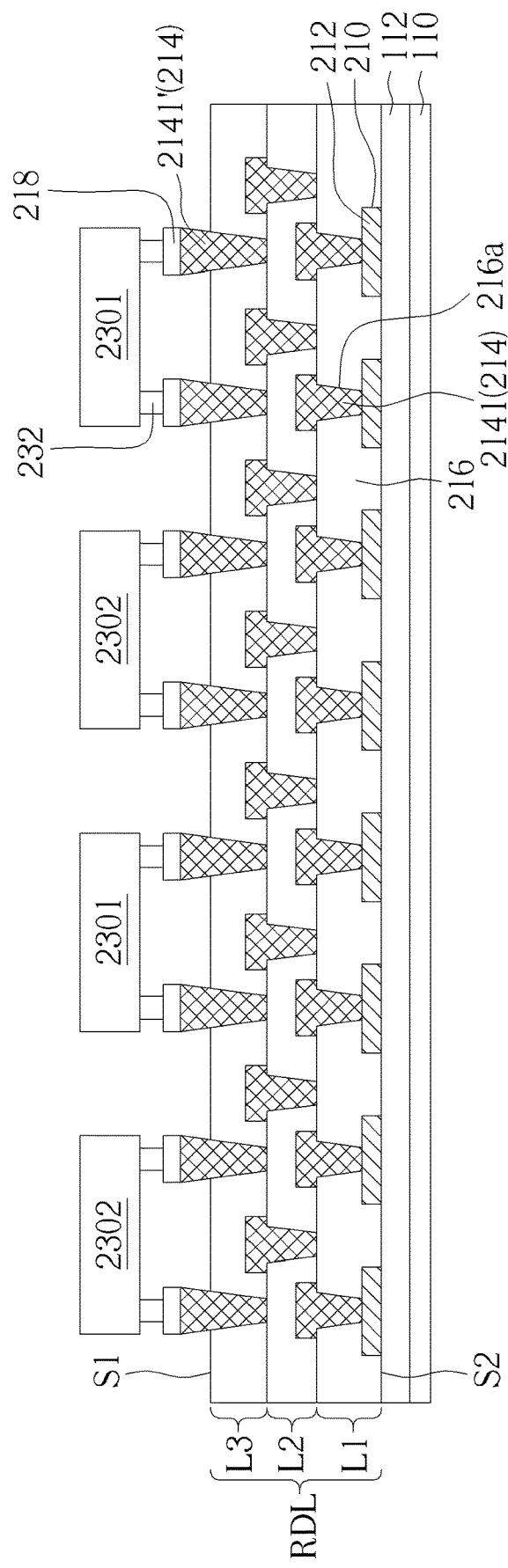

Referring to FIG. 4, after performing the first phase test (the short test) to the redistribution layer RDL, at least one electronic device is bonded on the first surface S1 of the redistribution layer RDL, wherein two kinds of electronic devices 2301 and 2302 are bonded, as shown in FIG. 4. In this embodiment, each of the electronic devices 2301, 2302 is bonded to the bonding electrodes 2141' through at least one bonding pad 232 of the electronic device 2301 or the electronic device 2302. The surface of each bonding electrode 2141' may have a bonding material 218 disposed between the electronic device 2301 or between the electronic device 2302 and the bonding electrode 2141'. Specifically, before bonding the electronic devices 2301, 2302, bonding materials 218 may be formed on each bonding electrode 2141'. After that, the bonding pads 232 of the electronic devices 2301, 2302 are bonded with the bonding materials 218 (such as by way of eutectic method), so as to electrically connect the electronic devices 2301, 2302 with the bonding electrodes 2141'. The bonding material 218 may include tin (Sn), nickel gold (Au/Ni) or ENEPIG (Electroless Nickel Electroless Palladium Immersion Gold, NiP-dAu), and the bonding pad 232 may include Sn, Ni, Au, or an alloy, but not limited thereto. For example, in other embodiments, solder balls may be used for bonding the electronic devices 2301, 2302 and the redistribution layer RDL. It should be noted that the electronic device 2301 and electronic device 2302 with two different integrated circuits respectively are provided in this embodiment as an example for explaining that more than one kind of electronic device can be bonded on the redistribution layer RDL. In other words, the bonded electronic devices may have the same or different integrated circuits, depending on the design of the product, and the bonding process may be performed by bonding one or more kinds of electronic devices and various amounts of electronic devices on the redistribution layer.

Figure 5:
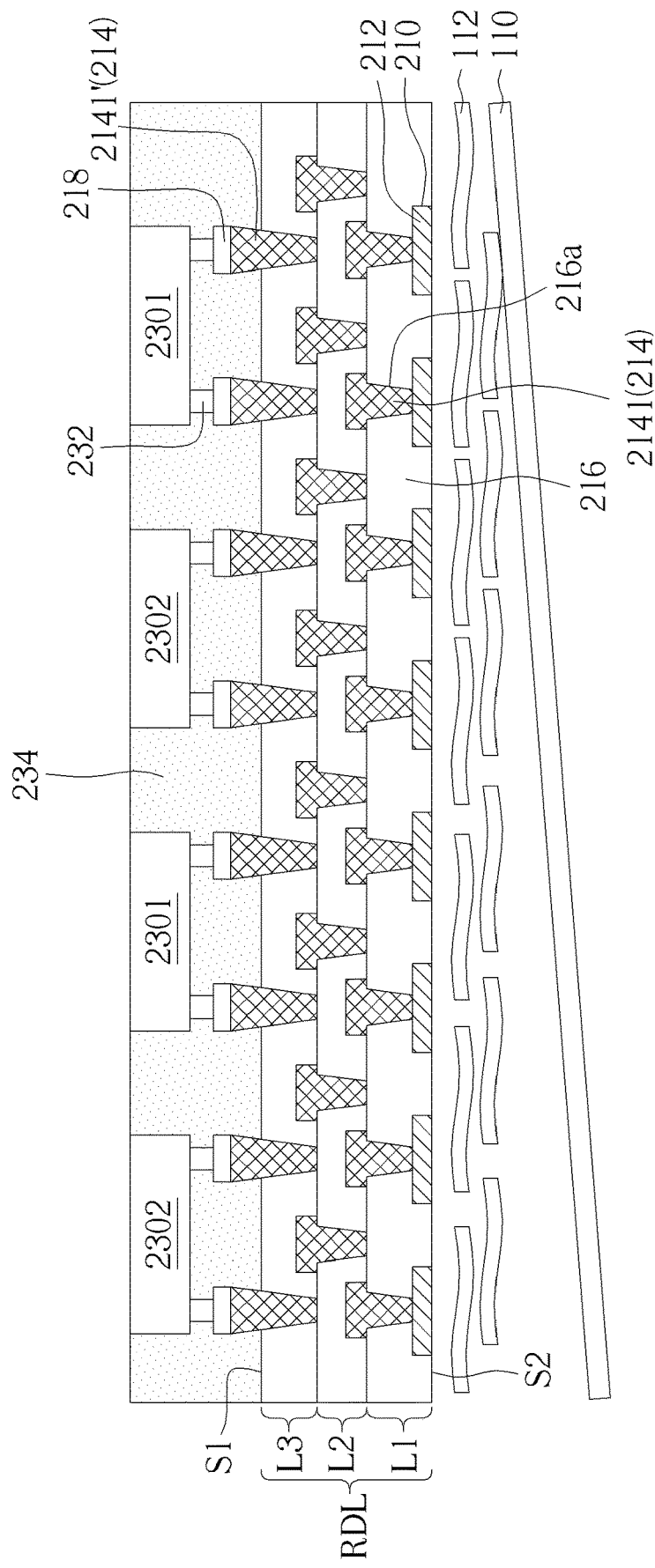

Next, referring to FIG. 5, a molding layer 234 is formed on the first surface S1 of the redistribution layer RDL. In this embodiment, the molding layer 234 is mainly disposed at the outer side of the electronic devices 2301, 2302, and does not cover the top surface of the electronic devices 2301, 2302 in general, but not limited thereto. In a variant embodiment, the molding layer 234 may cover the top surface of the electronic devices 2301, 2302. After that, a separation process is performed to make the release layer 112 and the substrate 110 separate from the redistribution layer RDL and the mounting layer 210, so as to expose the conductive pads 212 on the second surface S2 of the redistribution layer RDL. For example, the release layer 112 has a temporary adhesive function, thus the separation process may include illuminating the release layer 112 by laser to decrease the adhesion of the release layer 112 so as to lift off the release layer 112 and the substrate 110 from the redistribution layer RDL, but not limited thereto. After the separation process, a cleaning process may be selectively performed.

Figure 6:
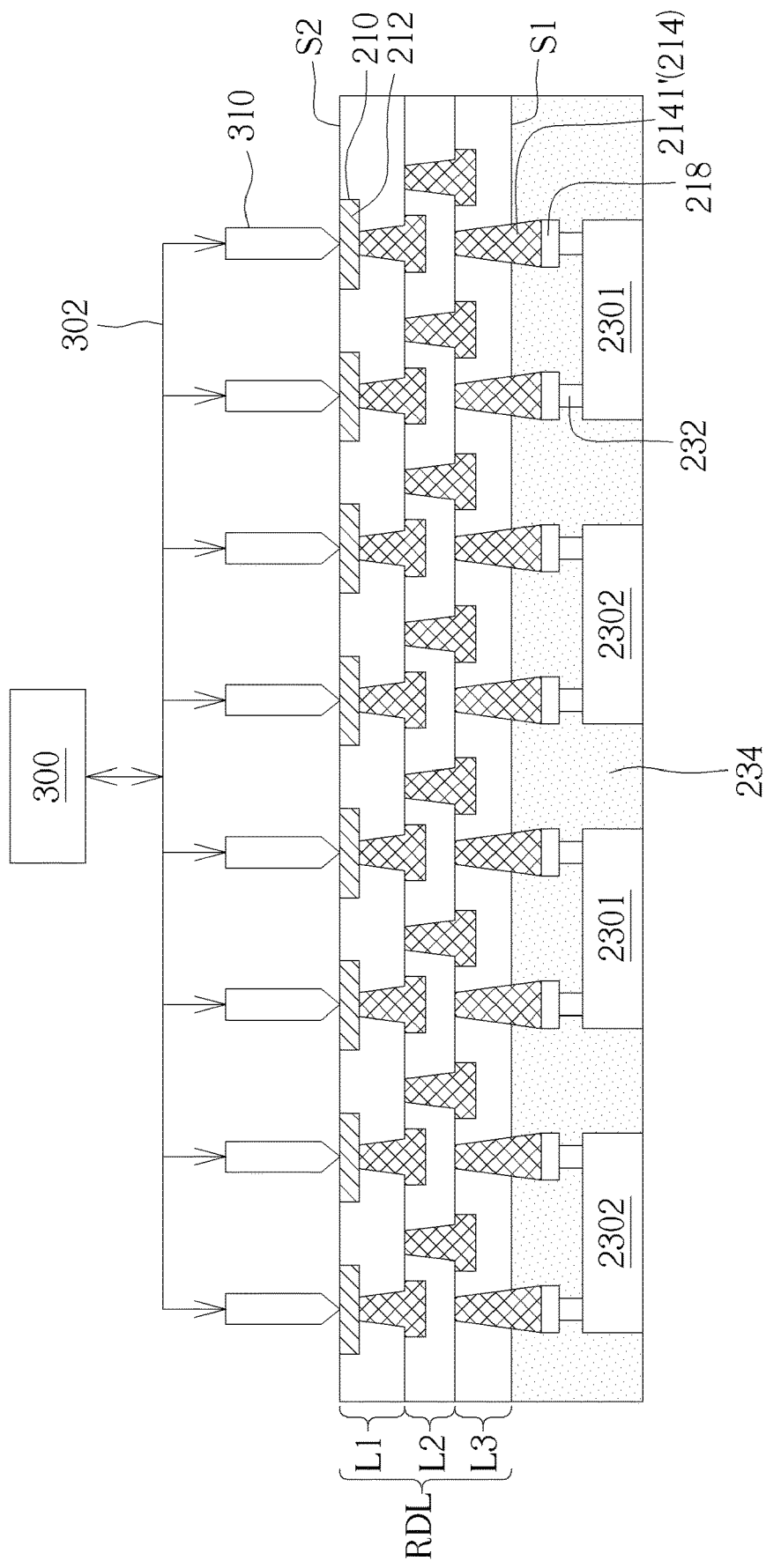

Next, referring to FIG. 6, a second phase test may be selectively performed, which includes an open test, a short test and a function test to the package structure of the electronic devices 2301, 2302. The second phase test may include using at least one probe to contact the exposed conductive pads 212 to perform the above mentioned tests. Specifically, the testing machine 300 may be provided, wherein the probes 310 are electrically connected to the testing machine 300 through conductive wires 302, and the probes 310 are respectively in contact with and electrically connected to the conductive pads 212 to perform the tests. It is noted that in the method of manufacturing the package structure in this embodiment, the tests to the overall electrical performance after the bonding of the redistribution layer RDL and the electronic devices 2301, 2302 can be performed before the solder balls are bonded to the conductive pads 212, so as to selectively repair or exclude the portion of the package structure with defect and avoid wasting further resources (such as process and raw materials) on the portion of the package structure with defect.

Figure 7:
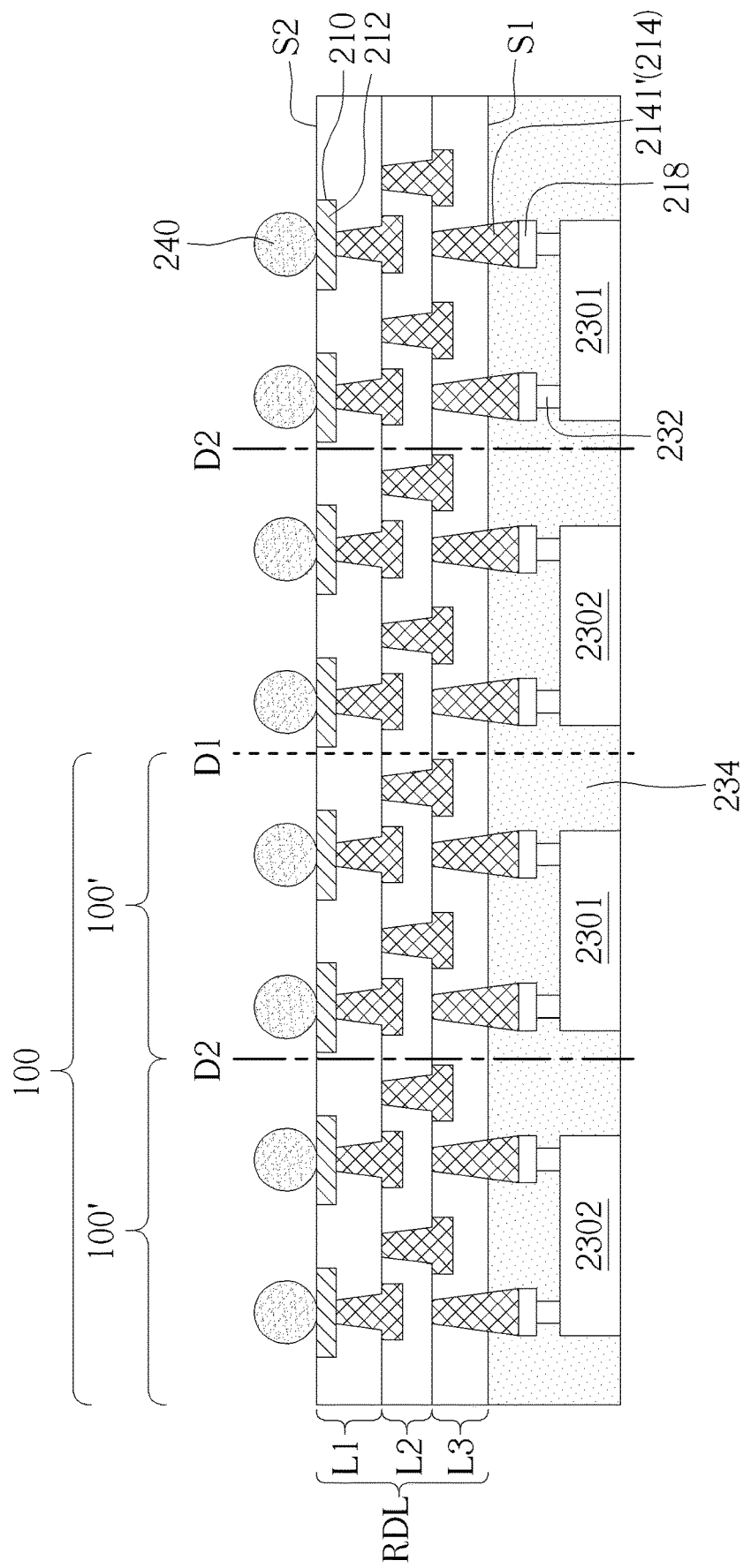

Referring to FIG. 7, after the second phase test, a solder ball 240 is formed on each of the conductive pads 212. Next, a dicing process (or sawing process) is carried out to form at least one package structure, wherein the dicing process can be a laser sawing process, a wheel cutting process or a punching process, but not limited thereto. The sawing position can be selected according to the design requirement. For example, the package structure may be sawed merely along the sawing line D1 or the sawing lines D2, or may be sawed along both the sawing line D1 and the sawing lines D2, but not limited thereto. As shown in FIG. 7, the package structures 100 can be formed if the package structure is sawed along only the sawing line D1, wherein the package structure 100 includes both the electronic device 2301 and electronic device 2302. If the sawing process is performed along both the sawing line D1 and the sawing lines D2, the package structures 100' can be formed, wherein only one electronic device (the electronic device 2301 or the electronic device 2302) is included in one package structure 100'. In other words, the package structures 100, 100' of the present disclosure may have any quantity of electronic devices, and the electronic device(s) in a single package structure 100 or a single package structure 100' may be either same or different.

The package structure and the manufacturing method thereof in the present disclosure are not limited to the above mentioned embodiments. Further embodiments or variant embodiments of the present disclosure are described below. It should be noted that the technical features in different embodiments described can be replaced, recombined, or mixed with one another to constitute another embodiment without departing from the spirit of the present disclosure. For making it easier to compare the difference between the embodiments and variant embodiments, the following description will detail the dissimilarities among different variant embodiments or embodiments and the identical features will not be redundantly described.

Figure 8:
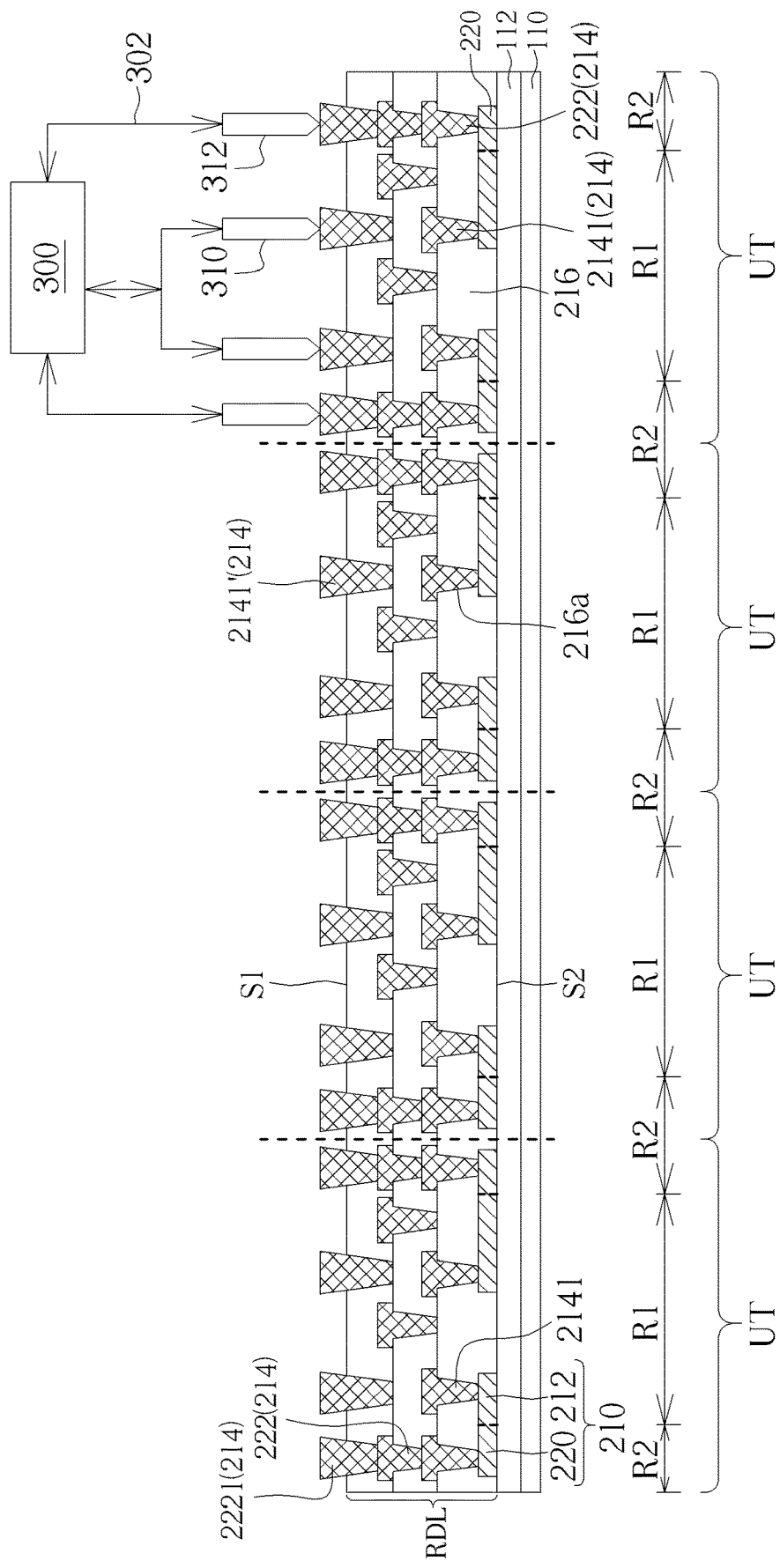
FIG. 8 to FIG. 13 are cross-sectional schematic diagrams illustrating fabrication processes of a method of manufacturing a package structure according to a second embodiment of the present disclosure.

Referring to FIG. 8 to FIG. 13, FIG. 8 to FIG. 13 are cross-sectional schematic diagrams illustrating fabrication processes of a method of manufacturing a package structure according to a second embodiment of the present disclosure. As shown in FIG. 8, similar to the first embodiment of the present disclosure, in the method of manufacturing a package structure in the second embodiment, the release layer 112 and the redistribution layer RDL are sequentially formed on the substrate 110. However, this embodiment is different from the first embodiment in that a first distribution region R1 and a second distribution region R2 of each package structure unit UT are defined on the substrate 110 according to the design scope of each package structure. In one package structure unit UT, the second distribution region R2 is disposed at the outer side of the first distribution region R1, and the conductive pads 212, the redistribution wires 2141, and a portion of the dielectric layer 216 is included in the first distribution region R1. In other words, it can be considered as that the redistribution layer RDL in this embodiment has the first distribution region R1 and the second distribution region R2. In addition, in this embodiment, the second distribution region R2 is disposed around the first distribution region R1 and surrounds the first distribution region R1, but not limited thereto. Furthermore, when forming the mounting layer 210, at least one testing pad 220 is also formed in the second distribution region R2, wherein the testing pad 220 directly contacts one of the conductive pads 212 and is electrically connected to the contacted conductive pad 212. Moreover, when forming the patterned conductive layer 214 of the redistribution layer RDL, at least one testing wire 222 is also formed in the second distribution region R2, wherein the testing wire 222 penetrates through the whole redistribution layer RDL to be electrically connected to the corresponding testing pads 220 and has one testing electrode 2221 exposed by the first surface S1 of the redistribution layer RDL. In other words, the testing electrode 2221 of this embodiment is disposed on the first surface S1 of the redistribution layer RDL and overlaps the second distribution region R2, while the bonding electrodes 2141' overlap the first distribution region R1. In this embodiment, at least one conductive pad 212 is electrically connected to one of the bonding electrode 2141' or the testing electrode 2221.

After forming the redistribution layer RDL and before bonding the electronic device, a first phase test is selectively performed to test the redistribution layer RDL. The testing machine 300 can be electrically connected to the bonding electrodes 2141' through a set of probes 310 electrically connected to the testing electrodes 2221 through another set of probes 312 to perform the short test and function test. Based on the requirement of different manufacturing process and the design of testing machine 300, the testing machine 300 may be used to perform a test to a single package structure unit UT or to plural package structure units UT at the same time. It should be noted that by using the probes 310, 312 of the testing machine 300, a complete open test to each set of redistribution wires of the redistribution layer RDL can be performed to effectively confirm the conductive performance and electrical properties of the circuits of the redistribution layer RDL because each package structure unit UT of this embodiment has the second distribution region R2 that has the testing pad 220 and the testing wire 222 with the testing electrode 2221 disposed therein. Furthermore, one single package structure unit UT is not limited to include only one testing pad 220 and one testing wire 222. For example, one package structure unit UT may include a plurality of testing wires 222 and a plurality of testing electrodes 2221 that correspond to each set of redistribution wires 2141, so as to perform tests to different sets of redistribution wires 2141 in the first phase test. Also, similar to the first embodiment, the manufacturing process of this embodiment is a RDL-first process, which means the first phase test is performed before bonding the electric device on the redistribution layer RDL, thus the process yield of the redistribution layer RDL can be confirmed so as to exclude the package structure units UT with defects and avoid to waste further resources.

Figure 9:
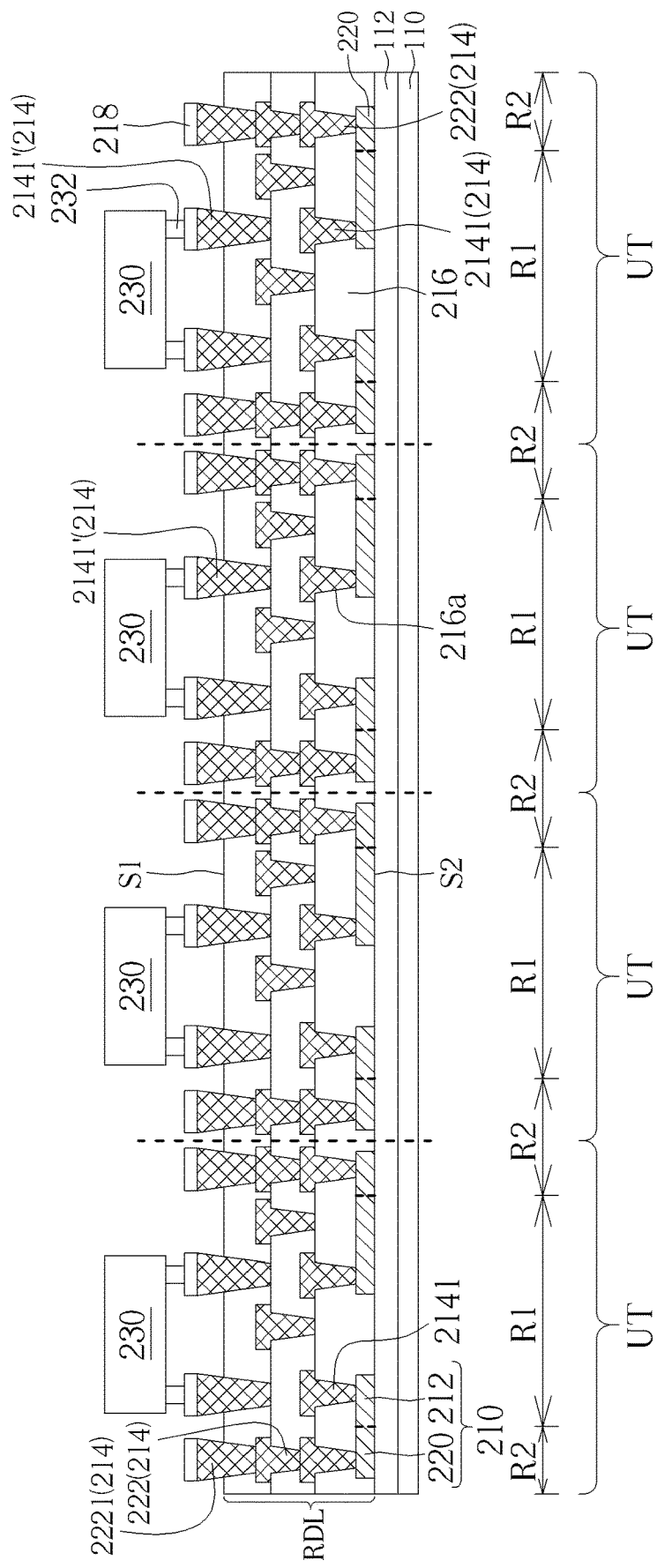
Figure 10:
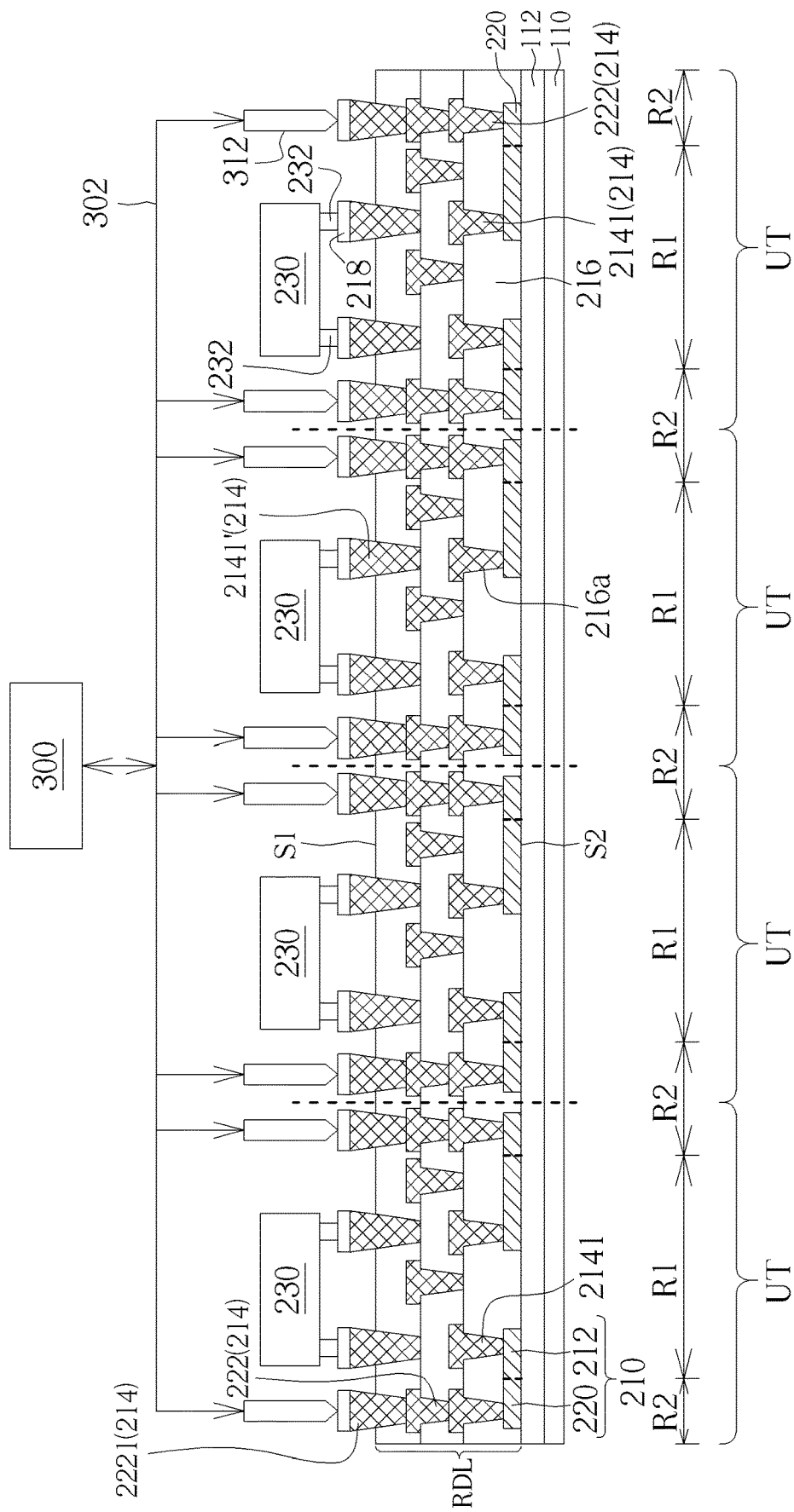

Next, referring to FIG. 9, at least one electronic device 230 is then bonding on the first surface S1 of the redistribution layer RDL. By at least one bonding pad 232 of the electronic device 230, the electronic device 230 is connected to the corresponding bonding electrode 2141'. Each package structure unit UT may have one or more identical or non-identical electronic devices 230, and in this embodiment only one kind of electronic devices 230 is illustrated. As shown in FIG. 10, after bonding the electronic device 230 and before forming the molding layer 234, a second phase test is carried out by using the probes 312 to perform a short test, an open test and a function test through the testing wires 222 that include testing electrodes 2221. In detail, the testing machine 300 is electrically connected to the testing wires 222 through the probes 312 that directly contact the bonding material 218 on the testing electrodes 2221 for performing the test. It is noted that the second phase test can confirm the electrical performance of the bonding of the redistribution layer RDL and the electronic devices 230 before the molding layer 234 is formed. For example, the function can be performed to confirm the electrical function effect of the electronic devices 230 and each of the redistribution wires 2141 in the redistribution layer RDL, so as to exclude the package structure unit UT with bad performance.

Figure 11:
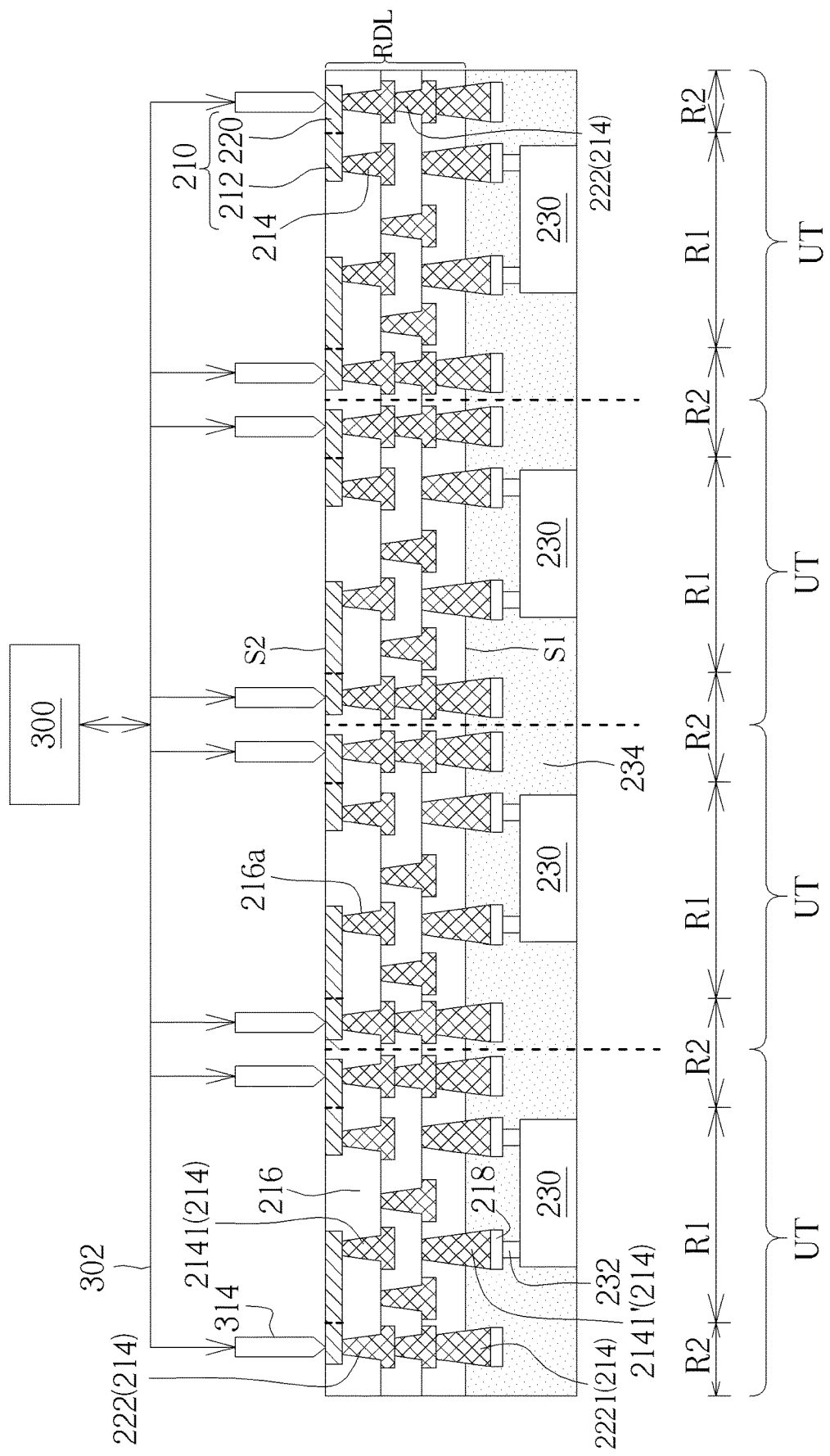

Next, referring to FIG. 11, the molding layer 234 is formed on the first surface S1 of the redistribution layer RDL after bonding the electronic device 230. A separation process is further performed to separate the release layer 112 and the substrate 110 from the redistribution layer RDL and the mounting layer 210. For example, the adhesion of the release layer 112 is first degraded and then the release layer 112 and the substrate 110 are removed by lifting process, but not limited thereto. After the separation process, a third phase test may be electively performed by using probes 314 of the testing machine 300 to respectively contact the testing pads 220 or conductive pads 212 for performing a short test, an open test and a function test. It is noted that before the solder ball 240 is formed on the conductive pads 212, the third phase test can confirm the electrical performance after the bonding of the redistribution layer RDL and the electronic devices 230 so as to obtain the overall process yield of the package structure units UT.

Figure 12:
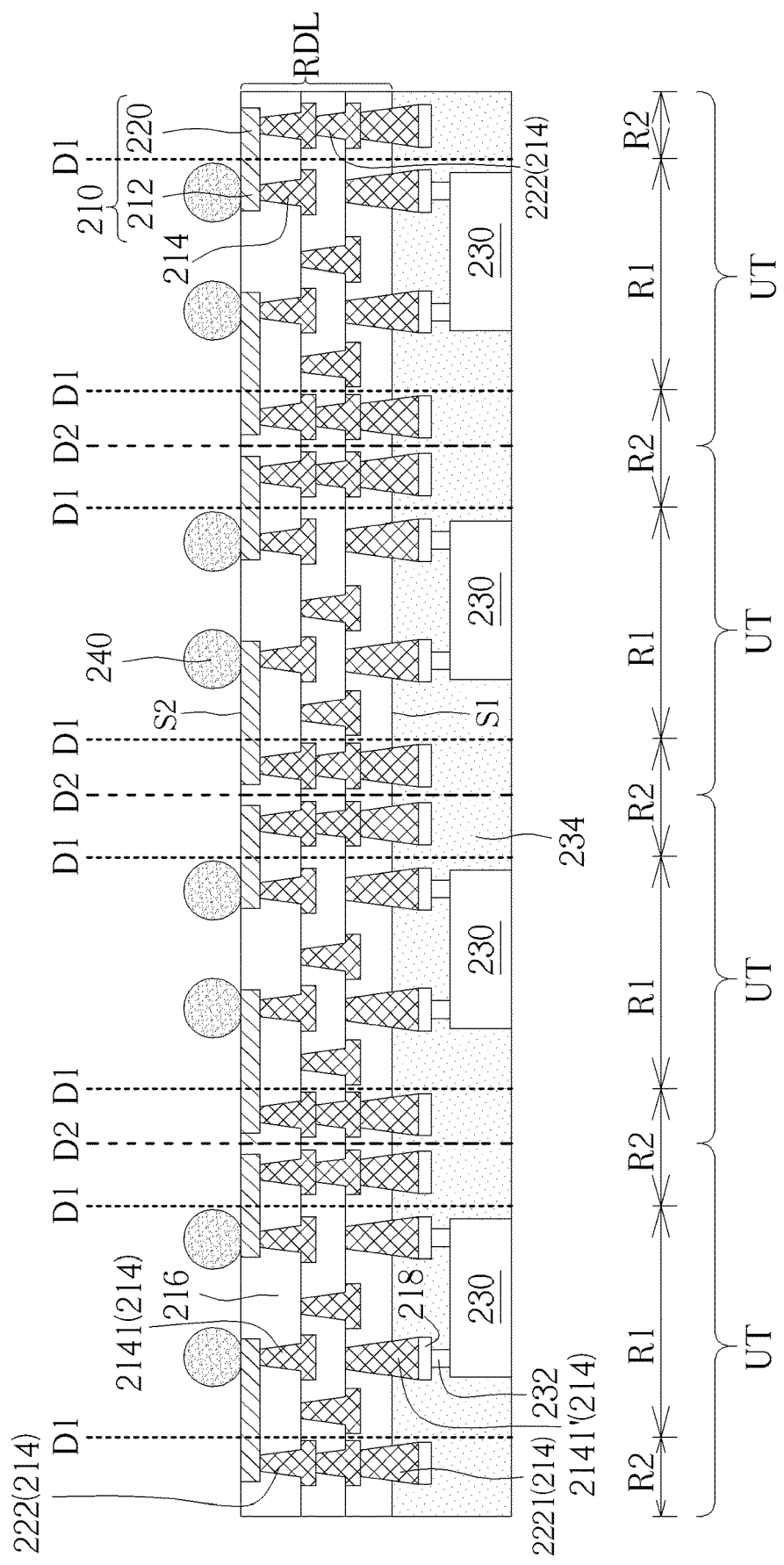
Figure 13:
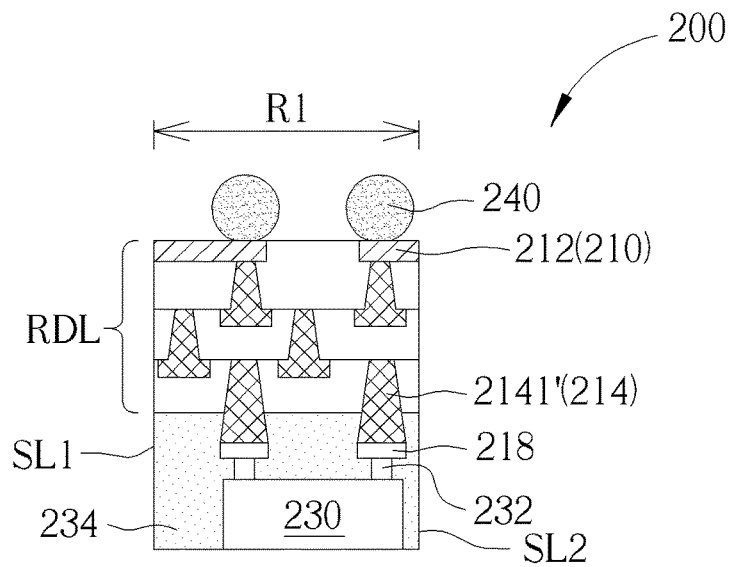

Referring to FIG. 12 and FIG. 13, the solder ball 240 is formed on each conductive pad 212. Then, a dicing process is performed to form at least one package structure 200. The sawing position of the dicing process can be selected according to the design requirement. For example, the redistribution layer RDL is sawed along the sawing lines D1 in this embodiment separate the portion of the redistribution layer RDL with the testing electrodes 2221 or testing wires 222 and the testing pads 220 from the package structure 200. In other words, the second distribution region R2 is removed and the first distribution region R1 is remained to form at least one package structure 200, as shown in FIG. 13. It is noted that the conductive pads 212 originally connected to the testing pads 220 will be exposed by the sidewalls SL1, SL2 of the package structure 200 because the testing pads 220 are removed by the dicing process or sawing process. That is to say, the exposed mounting layer 210 can be seen at the surface of the sidewalls SL1, SL2 of the package structure 200.

Figure 14:
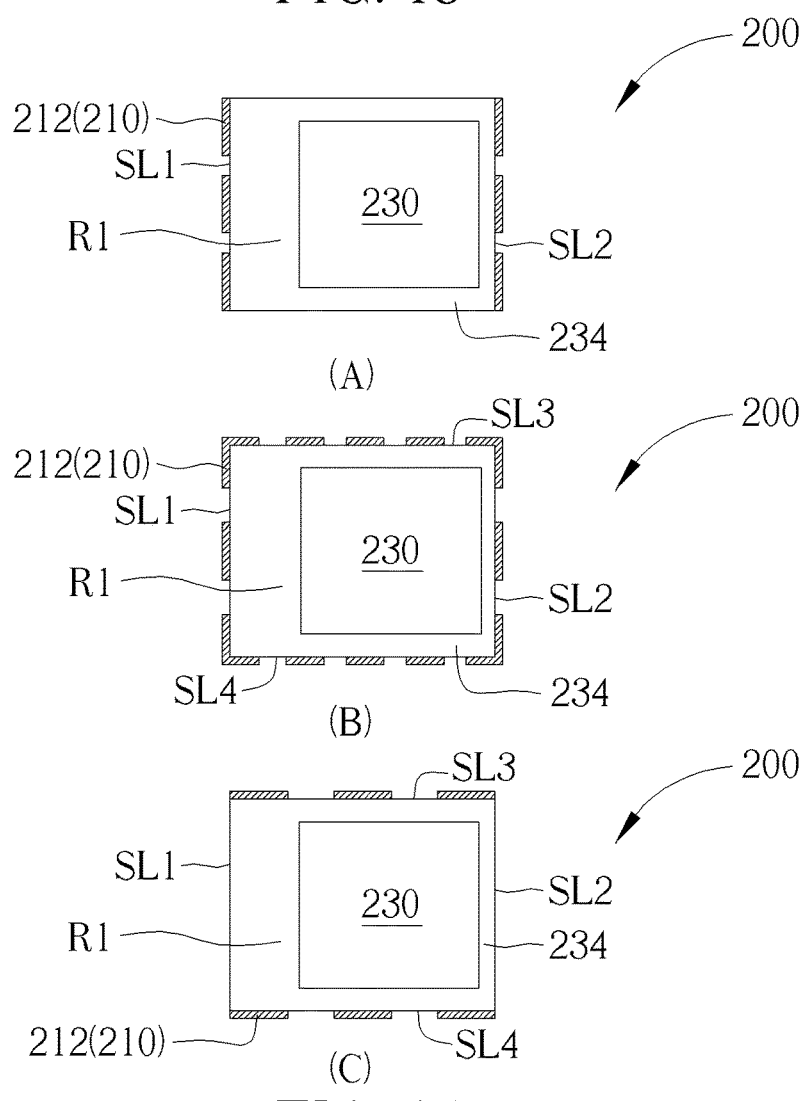
FIG. 14 is a top-view schematic diagram of a package structure according to the second embodiment of the present disclosure.

Referring to FIG. 14, FIG. 14 is a top-view schematic diagram of a package structure according to the second embodiment of the present disclosure, wherein the example (A), example (B) and example (C) illustrate the exposure of the mounting layer 210 in three variant embodiments respectively. As mentioned above, after sawing the redistribution layer RDL along the sawing lines D1 and removing the second distribution region R2, at least one conductive pad 212 will be exposed on a surface of at least one sidewall of the redistribution layer RDL. The position and the number of the conductive pads 212 exposed on the sidewall of the redistribution layer RDL are generally related to the design of the position of the testing wires 222 (including the testing electrodes 2221) and the testing pads 220 in the second distribution region R2. In the example (A) of FIG. 14, the conductive pads 212 or the mounting layer 210 is exposed by the lateral sidewalls, such as the left sidewall SL1 and the right sidewall SL2, of the package structure 200; in the example (B) of FIG. 14, the conductive pads 212 or the mounting layer 210 is exposed by the lateral sidewalls, the left sidewall SL1 and the right sidewall SL2, and longitudinal sidewalls, the upper sidewall SL3 and the lower sidewall SL4 of the package structure 200, wherein a portion of the conductive pads 212 extend from one lateral sidewall to one longitudinal sidewall; and in the example (C) of FIG. 14, the conductive pads 212 are exposed only by the upper sidewall SL3 and the lower sidewall SL4. It should be noted that the position where the conductive pads 212 are exposed is not limited thereto FIG. 14. For example, the conductive pads 212 may be exposed by the lateral sidewalls or the longitudinal sidewalls in an asymmetric way, or be exposed by only one of the left sidewall SL1, the right sidewall SL2, the upper sidewall SL3 or the lower sidewall SL4. Moreover, in order to highlight the positions of the conductive pads 212 being exposed, the conductive pads 212 illustrated in FIG. 14 are protruded from the above-mentioned sidewalls. However, in reality, the left sidewall SL1, the right sidewall SL2, the upper sidewall SL3 and the lower sidewall SL4 of the package structure 200 fabricated according to the manufacturing method of the package structure 200 of the present disclosure have smooth surfaces. In other words, the surfaces of the conductive pads 212 and its corresponding surfaces of the sidewall SL1, sidewall SL2, sidewall SL3 or sidewall SL4 are at the same plane and aligned with each other.

Figure 15:
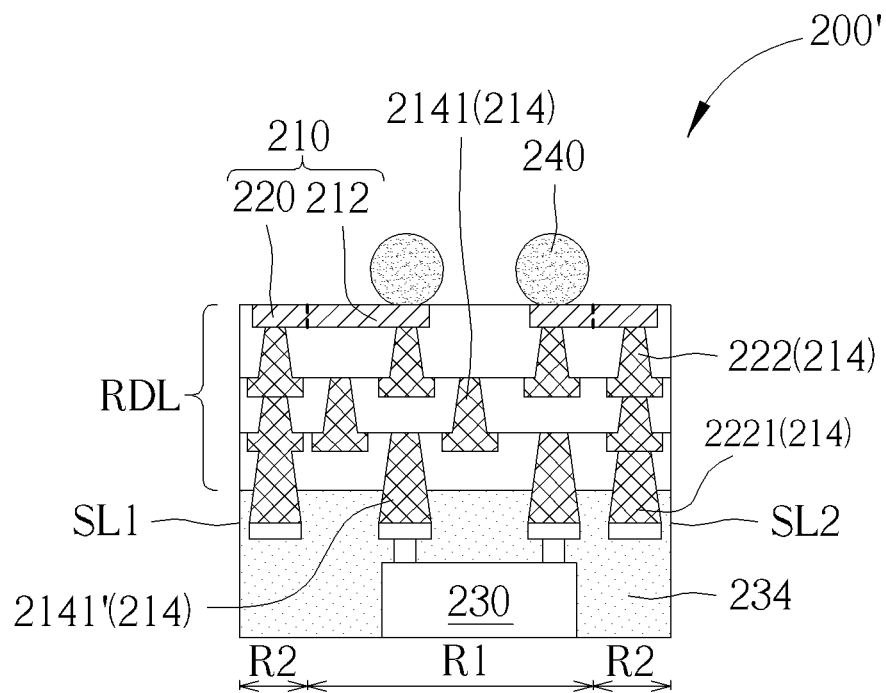
FIG. 15 is a cross-sectional schematic diagram of a package structure according to a variant embodiment of the second embodiment of the present disclosure
Figure 16:
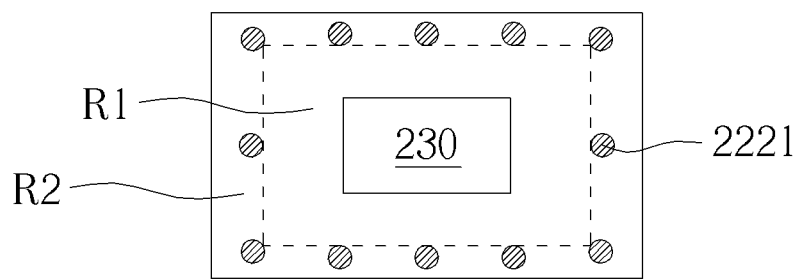
FIG. 16 is a top-view schematic diagram of the package structure shown in FIG. 15.

Referring to FIG. 15 and FIG. 16, FIG. 15 illustrates a cross-sectional schematic diagram of a package structure and related method according to a variant embodiment of the second embodiment of the present disclosure, and FIG. 16 is a top-view schematic diagram of the package structure shown in FIG. 15. In this variant embodiment, the dicing process is performed by sawing the redistribution layer RDL the sawing lines D2 shown in FIG. 12, and therefore the package structure 200' is formed as shown in FIG. 15. The dicing process in this variant process does not remove the second distribution region R2, hence the package structure 200' still has the testing wires 222 (including the testing electrodes 2221) and the testing pads 220. In this situation, the mounting layer 210 may not be exposed on the surfaces of the sidewalls of the package structure 200' (for example, the sidewalls SL1, SL2). However, in some cases, the mounting layer 210 may still be exposed on the surfaces of the sidewalls of the package structure 200'. It should be noted that actually the test electrodes 2221 should not be seen from in the top view of the package structure 200', but the testing electrodes 2221 is illustrated in FIG. 16 for showing the relative positions of the testing electrodes 2221 to the first distribution region R1, wherein the testing electrodes 2221 are disposed in the second distribution region R2, surrounding the first distribution region R1, while the electronic device 230 is disposed in the first distribution region R1.

According to the above-described second embodiment and its variant embodiment, the package structure fabricated according to the manufacturing method of the present disclosure may have both the first distribution region and the second distribution region, or only have the first distribution region without the second distribution region, based on the product design and requirement.

Figure 17:
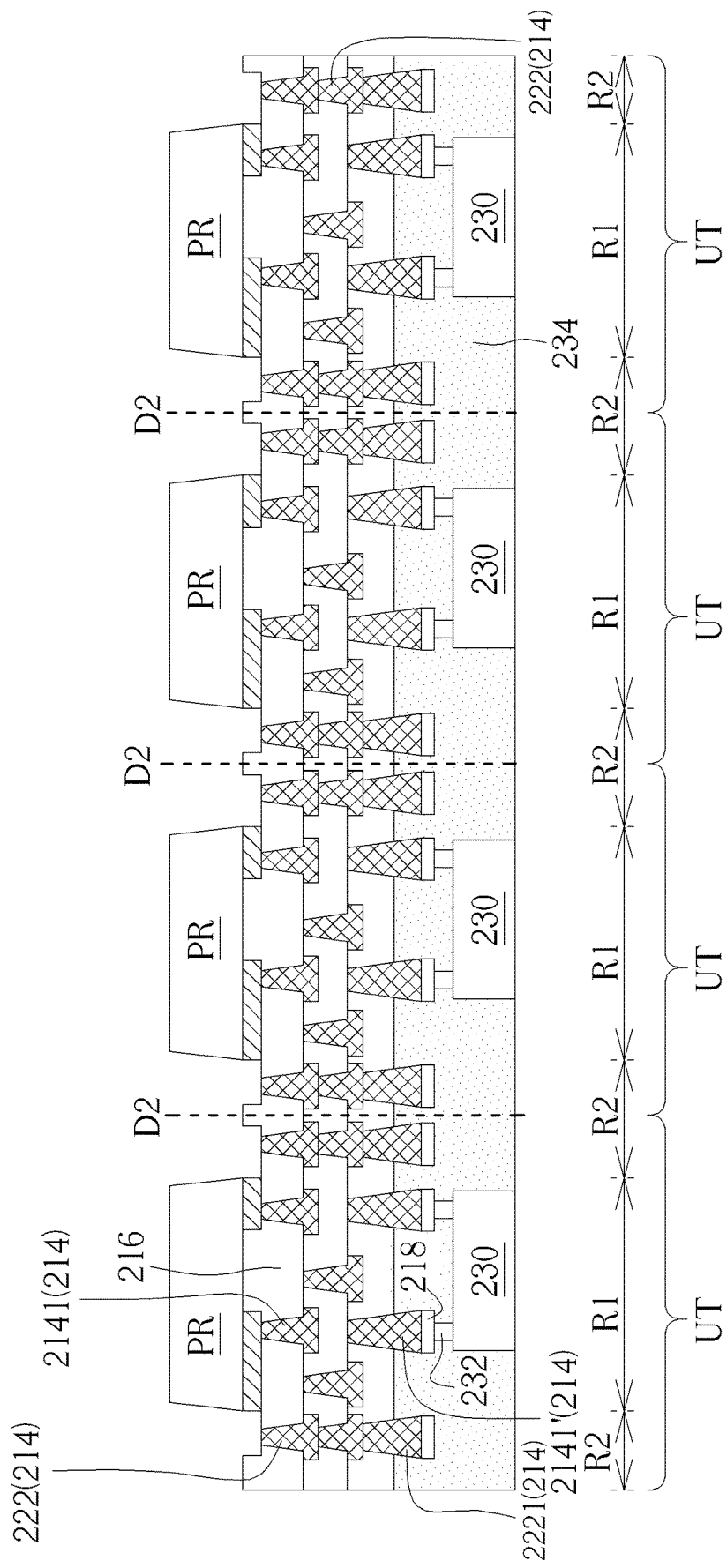
FIG. 17 and FIG. 18 are cross-sectional schematic diagrams illustrating the package structure and related manufacturing method according to another variant embodiment of the second embodiment of the present disclosure.
Figure 18:
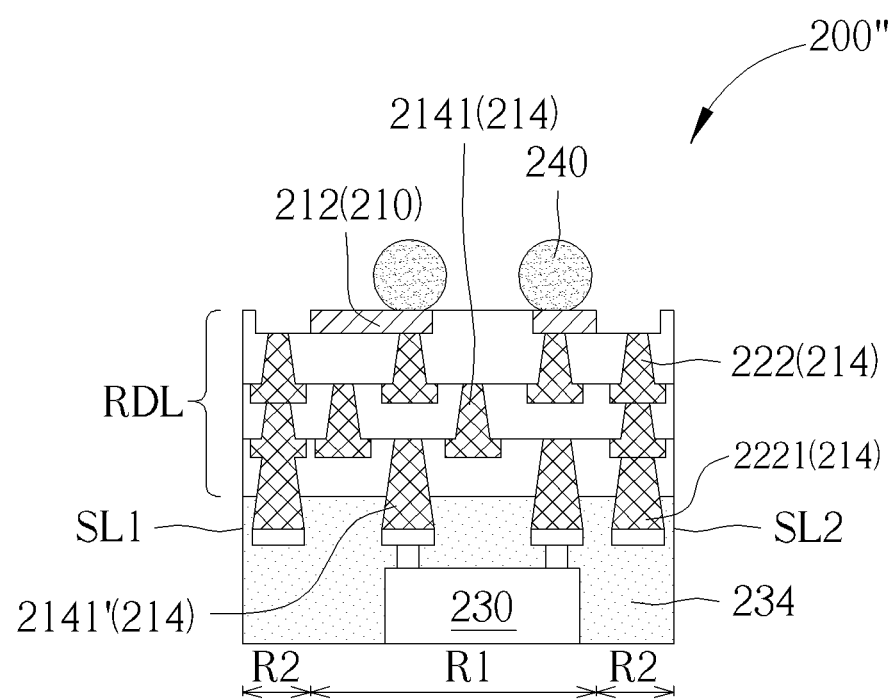

Referring to FIG. 17 and FIG. 18, FIG. 17 and FIG. 18 are cross-sectional schematic diagrams illustrating the method of manufacturing a package structure according to another variant embodiment of the second embodiment of the present disclosure, wherein FIG. 17 is subsequent to FIG. 11. As shown in FIG. 17, after removing the release layer 112 and the substrate 110, the method further includes a step of removing the testing pads 220. The method of removing the testing pads 220 may include, for example, performing a lithography and etching process, such as using a patterned photoresist layer PR to cover the first distribution regions R1 and expose the testing pads 220 in the second distribution regions R2, followed by performing an etching process to the testing pads 220 to remove the exposed testing pads 220, but not limited thereto. After that, the solder balls 240 are formed on the conductive pads 212 respectively, and a dicing process is further carried out along the sawing lines D2 to form the package structure 200", as show in FIG. 18. It is noted that in this variant embodiment, the testing wires 222 penetrate through the whole redistribution layer RDL and are exposed by the bottom of the package structure 200", i.e. the second surface S2 of the redistribution layer RDL. In the above-mentioned third phase test, the probes 314 are used to directly contact the testing pads 220 to perform the short test, open test and function test, thus the surfaces of the testing pads 220 may be scratched to form cavities. Hence, by removing the testing pads 220, the bottom of the package structure 200" may have a better appearance.

Figure 19:
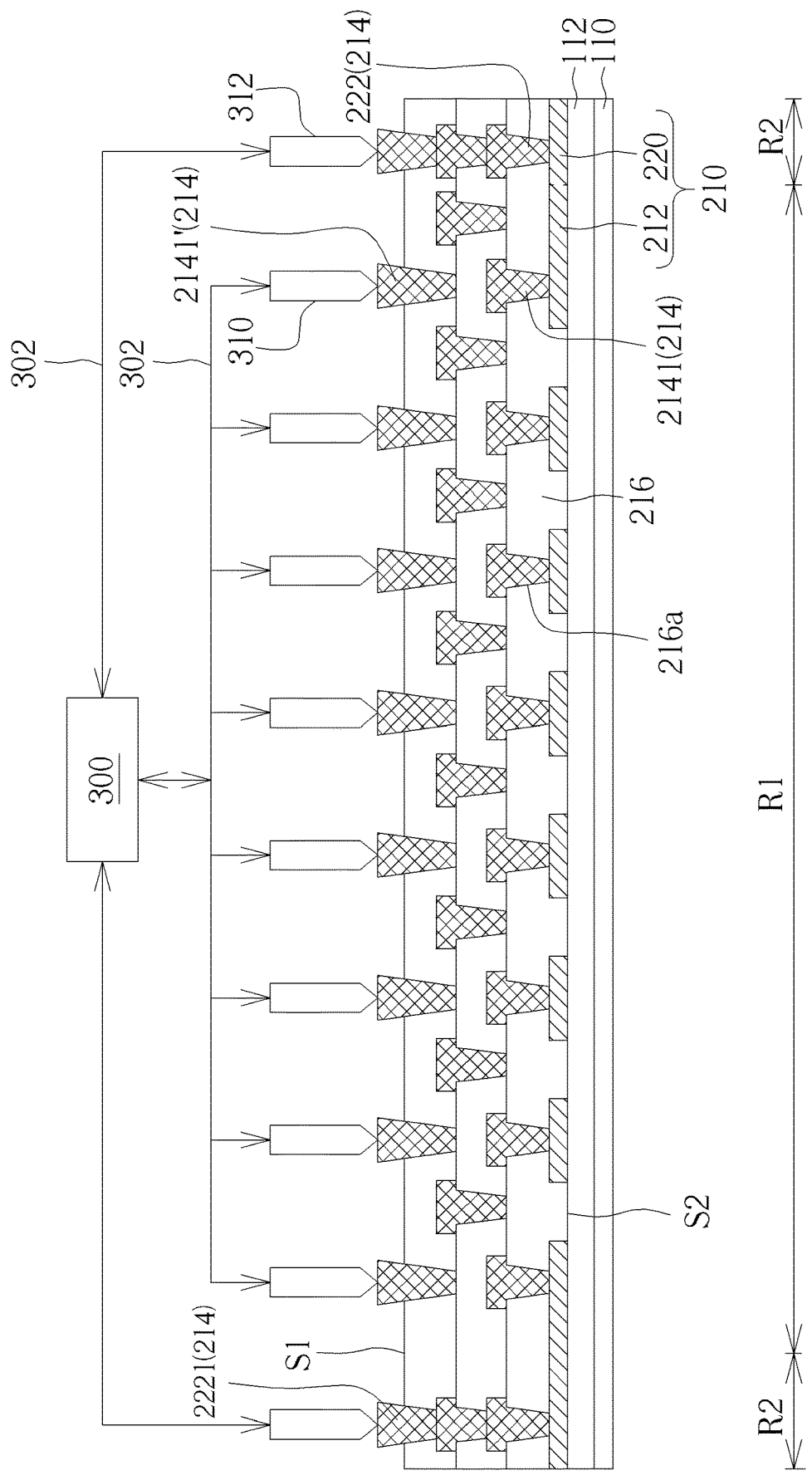
FIG. 19 is a cross-sectional schematic diagram illustrating fabrication process of a method of manufacturing a package structure according to a third embodiment of the present disclosure.

Referring to FIG. 19, FIG. 19 is a cross-sectional schematic diagram illustrating fabrication process of a method of manufacturing a package structure according to a third embodiment of the present disclosure, wherein only one package structure unit UT is illustrated in FIG. 19. This embodiment is different from the second embodiment in that the package structure unit UT includes three or more conductive pads 212 and corresponding redistribution wires 2141 in the first distribution region R1, while not all of the conductive pads 212 are connected to a corresponding testing pad 220. Furthermore, when performing the first phase test, each bonding electrode 2141' can be contacted by one probe 310 for electrically connection, while each testing electrode 2221 can be contacted by one probe 312 for electrically connection, so as to perform the short test and the open test.

Figure 20:
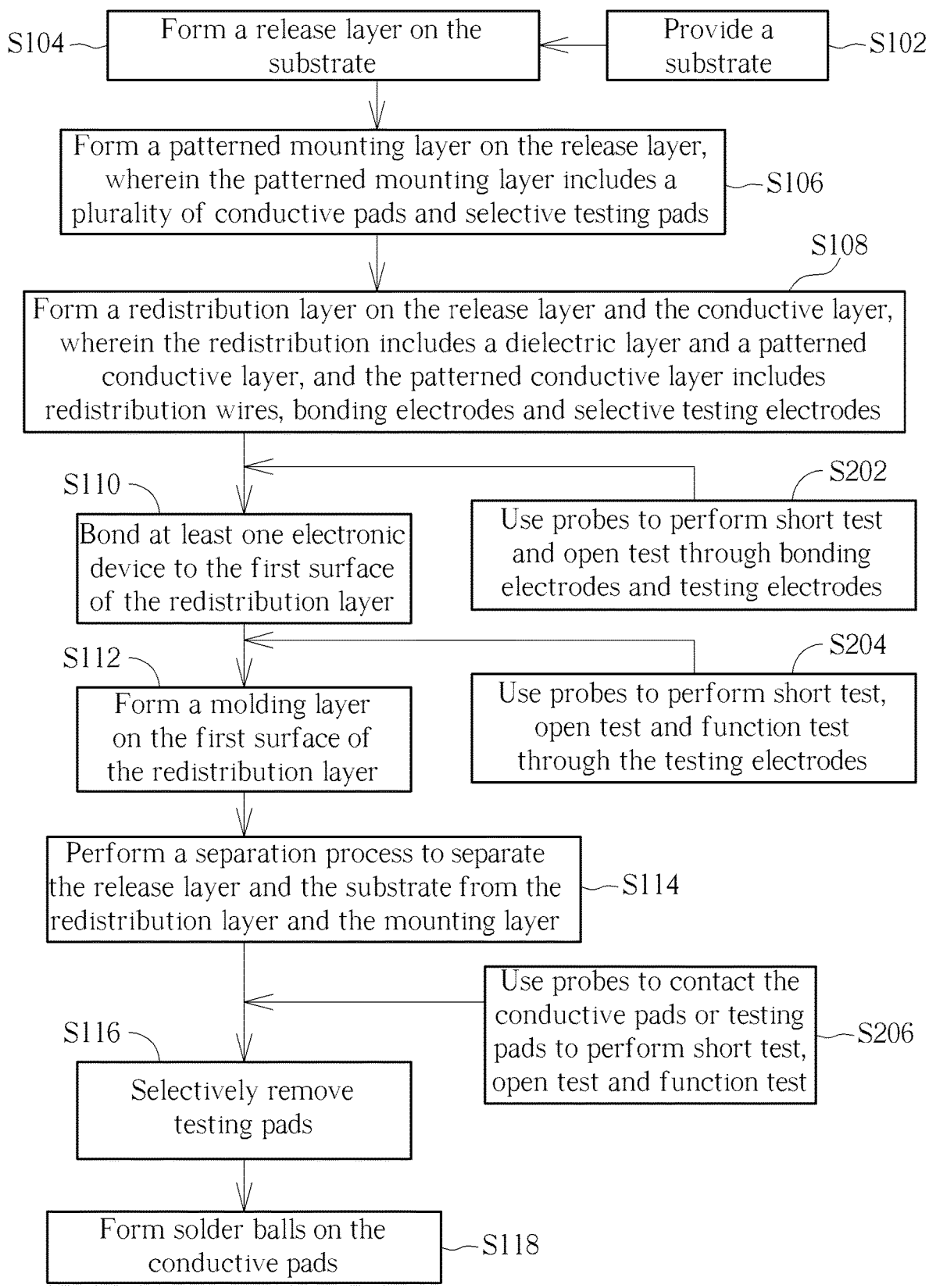
FIG. 20 is a schematic diagram of process flow of a method of manufacturing a package structure according to the present disclosure.

From the above, the method of manufacturing the package structure according to the present disclosure mainly includes the steps illustrated in FIG. 20, which is described below.

Step S102: Provide a substrate, wherein a width of the substrate in any direction is greater than or equal to 400 mm.

Step S104: Form a release layer on the substrate.

Step S106: Form a patterned mounting layer on the release layer, wherein the mounting layer includes a plurality of conductive pads spaced apart from each other. In some embodiments, the mounting layer further includes testing pads disposed in the second distribution region.

Step S108: Form a redistribution layer on the release layer and the conductive pads, wherein the redistribution layer includes at least one dielectric layer, at least one patterned conductive layer disposed on the dielectric layer, and at least one through hole penetrating the dielectric layer to connect the patterned conductive layer. The patterned conductive layer includes the redistribution wires, bonding electrodes, selective testing wires and selective testing electrodes, wherein the testing wires and testing electrodes are disposed in the second distribution region and electrically connected to the corresponding testing pads.

Step S202: After forming the redistribution layer and before bonding the electronic device, selectively use the probes to respectively contact the bonding electrodes and the testing electrodes, so as to perform a short test and an open test.

Step S110: Bond at least one electronic device to the first surface of the redistribution layer.

Step S204: Selectively perform a short test, an open test and a function test through the testing electrodes or the testing wires by using probes.

Step S112: Form a molding layer on the first surface of the redistribution layer.

Step S114: Perform a separation process to separate the release layer and the substrate from the redistribution layer and the mounting layer.

Step S206: Selectively perform a short test, an open test and a function test by using the probes to contact the testing pads or the conductive pads.

Step S116: Selectively remove the testing pads.

Step S118: Form the solder balls respectively on the conductive pads. Afterwards, selectively perform a dicing process to form the package structure with desired size as needed according to the design requirement.

To sum up, the package structure and the manufacturing method thereof of the present disclosure adopts a RDL-first process to form a fan-out panel level package (FOPLP). Moreover, by the arrangement of the second distribution region with the testing pads and the testing wires, the individual or overall electrical property and function can be tested in various phases of the fabrication processes to realize the qualities of the redistribution layer, the connection of the electronic devices with the redistribution layer, and the package structure, so as to repair or exclude the devices with defects during the fabrication processing and avoid wasting resources on the devices with defects in the following processes. A special package structure is provided according to the manufacturing method of the present disclosure. For example, in the case when the package structure has a second distribution region, the testing wires that include testing electrodes penetrate through the whole redistribution layer, wherein the bottom of the package structure may have either testing pads or exposed testing wires in the design that the testing pads are removed. In another aspect, in the case when the second distribution region is cut off from the package structure, the mounting layer is exposed on the surface of the sidewall(s) of the package structure. It should be noted that, the package structure in this present disclosure may be applied to electronic device packages with high pin density, and may be suitable in applications of single electronic device module, multi electronic device module, multi electronic device stacking module or other suitable package structures.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A method of manufacturing a package structure, comprising:
providing a substrate, wherein a width of the substrate in any direction is greater than or equal to 400 mm;
forming a release layer on the substrate;
forming a mounting layer on the release layer, wherein the mounting layer is a patterned layer and comprises a plurality of conductive pads spaced apart from each other;
forming a redistribution layer on the release layer and the conductive pads, wherein the redistribution layer has a first surface at a side of the redistribution layer opposite to the release layer, and the redistribution layer includes at least one bonding electrode disposed at the first surface;
bonding at least one electronic device on the first surface of the redistribution layer, the electronic device being electrically connected to the bonding electrode;
forming a molding layer on the first surface of the redistribution layer;
performing a separation process to separate the release layer and the substrate from the redistribution layer and the mounting layer; and
forming a solder ball on one of the conductive pads.

2. The method of manufacturing the package structure according to claim 1, wherein the method further comprises after forming the redistribution layer and before bonding the electronic device, using at least one probe to contact the bonding electrode to perform a test to the redistribution layer.

3. The method of manufacturing the package structure according to claim 1, wherein at least one testing electrode is disposed on the first surface of the redistribution layer, the testing electrode is disposed adjacent to the bonding electrode, and at least one portion of the bonding electrode overlaps the electronic device.

4. The method of manufacturing the package structure according to claim 3, wherein the method further comprises after forming the redistribution layer and before bonding the electronic device, using at least one probe to contact the bonding electrode and using at least one probe to contact the testing electrode to perform a test.

5. The method of manufacturing the package structure according to claim 3, wherein the method further comprises after bonding the electronic device and before forming the molding layer, using at least one probe to electrically contact the testing electrode to perform a test.

6. The method of manufacturing the package structure according to claim 3, wherein the method further comprises removing the testing electrode after separating the release layer and the substrate from the redistribution layer and the mounting layer.

7. The method of manufacturing the package structure according to claim 3, wherein the method further comprises performing a dicing process to form at least one package structure after forming the solder ball, wherein the dicing process makes the testing electrode and a portion of the redistribution layer on which the testing electrodes disposed separate from the package structure, and a portion of the conductive pads is exposed on a sidewall of the package structure.

8. The method of manufacturing the package structure according to claim 1, wherein the method further comprises performing a dicing process to form at least one package structure after forming the solder ball, wherein the package structure comprises a plurality of electronic devices with same or different integrated circuits.

9. The method of manufacturing the package structure according to claim 1, wherein a step of forming the redistribution layer comprises:
  forming a dielectric layer on the release layer;
  forming a plurality of through holes in the dielectric layer;
  forming a conductive layer on the dielectric layer, wherein the through holes are filled by the conductive layer; and
  performing a patterning process to the conductive layer for forming a patterned conductive layer.

* * * * *